(12) United States Patent
Lee et al.

(10) Patent No.: US 9,473,084 B2
(45) Date of Patent: Oct. 18, 2016

(54) POWER AMPLIFYING APPARATUS

(71) Applicant: HTC Corporation, Taoyuan County (TW)

(72) Inventors: Chien-Hua Lee, Taoyuan County (TW); Yen-Chuan Lin, Taoyuan County (TW); Jin-Fu Yeh, Taoyuan County (TW); Tian-Wei Huang, Taoyuan County (TW)

(73) Assignee: HTC Corporation, Taoyuan (TW)

( * ) Notice: Subject to any disclaimer, the term of this patent is extended or adjusted under 35 U.S.C. 154(b) by 245 days.

(21) Appl. No.: 14/146,732

(22) Filed: Jan. 3, 2014

(65) Prior Publication Data

US 2015/0194941 A1 Jul. 9, 2015

(51) Int. Cl.
| | |
|---|---|
| *H03F 3/21* | (2006.01) |
| *H03F 3/24* | (2006.01) |
| *H03F 3/189* | (2006.01) |
| *H03F 3/60* | (2006.01) |
| *H03F 3/68* | (2006.01) |
| *H04B 3/56* | (2006.01) |
| *H04L 5/14* | (2006.01) |

(52) U.S. Cl.
CPC ............. *H03F 3/211* (2013.01); *H03F 3/245* (2013.01); *H03F 3/602* (2013.01); *H03F 3/68* (2013.01); *H04B 3/56* (2013.01); *H04L 5/1461* (2013.01); *H03F 2200/423* (2013.01); *H03F 2203/21142* (2013.01)

(58) Field of Classification Search
USPC ......... 330/295, 124 R, 84, 286, 53, 252–261
See application file for complete search history.

(56) References Cited

U.S. PATENT DOCUMENTS

| | | | |
|---|---|---|---|
| 8,160,520 B2 | 4/2012 | Srinivasan et al. | |
| 8,588,114 B2* | 11/2013 | Dupuy | H04B 1/0053 370/297 |
| 2009/0201084 A1 | 8/2009 | See et al. | |
| 2010/0291888 A1 | 11/2010 | Hadjichristos et al. | |
| 2011/0310775 A1 | 12/2011 | Khlat et al. | |
| 2012/0200356 A1 | 8/2012 | Bendixen | |
| 2014/0327483 A1* | 11/2014 | Balteanu | H03F 3/245 330/295 |

FOREIGN PATENT DOCUMENTS

| | | |
|---|---|---|
| GB | 2500265 | 9/2013 |
| TW | 201225516 | 6/2012 |
| TW | 201336225 | 9/2013 |

OTHER PUBLICATIONS

Jin-Fu Yeh, et al., "A 60-GHZ Power Amplifier Design Using Dual-Radial Symmetric Architecture in 90-nm Low-Power CMOS," IEEE Transactions on Microwave Theory and Techniques, vol. 61, No. 3, Mar. 2013, pp. 1280-1290.
"Search Report of Europe Counterpart Application", issued on May 20, 2015, p. 1-p. 3.
"Office Action of Europe Counterpart Application", issued on Jun. 15, 2015, p. 1-p. 5.
"Office Action of Taiwan Counterpart Application", issued on Jan. 21, 2016, p. 1-p. 8.

\* cited by examiner

*Primary Examiner* — Hieu Nguyen
(74) *Attorney, Agent, or Firm* — Jianq Chyun IP Office

(57) ABSTRACT

A power amplifying apparatus is provided. The power amplifying apparatus includes a first substrate and N power amplifiers. The N power amplifiers are disposed on the first substrate, the power amplifiers respectively receives N input signals, wherein frequency bands of at least two of the inputs signals are different. And the power amplifiers respectively generate M output signals, wherein the N is a positive integer greater than 2, and M is a positive integer not equal to N.

15 Claims, 5 Drawing Sheets

POWER AMPLIFYING APPARATUS

TECHNICAL FIELD

The present invention generally relates to a power amplifying apparatus, more particularly, a power amplifying apparatus capable of process signals in multi-frequency bands.

BACKGROUND

With the rapid evolution of wireless communication technologies, having wireless communication function has become a necessary requirement for an electronic device. However, with the premise of using the low-cost CMOS manufacturing process, the problems of lower breakdown voltage and higher substrate depletion should be overcome. Therefore, in the design of power amplifier, a technical skill of using transformer to conduct power synthesis so as to shrink the size of transistors and improve the output power has been proposed in conventional skills in the art.

A three-dimensional structured power amplifying apparatus has been proposed in conventional art, the three dimensional structured power amplifying apparatus uses a power amplifier with symmetrical structure to receive feed-in signals, and amplifying the feed-in signals to reduce a loss on power allocation. Also, the three dimensional structured power amplifying apparatus could collect the signals to the center of the symmetrical structure, so that the in-phase signals could be summed.

However, the above-described three-dimensional structured power amplifying apparatus could only process input signals in one signal frequency bands, under the requirement of an electronic device should have the ability of processing input signals in multi-frequency bands, providing a new type of power amplifying apparatus has become an important issue for designers.

SUMMARY

The present invention is directed to a power amplifying apparatus, capable of providing function of amplifying power of input signals in multiple frequency bands.

The power amplifying apparatus of the present invention includes a first substrate and N power amplifiers. The N power amplifiers are disposed on the first substrate. the power amplifiers respectively receives N input signals, wherein the frequency bands of at least two of the inputs signals are different, and the power amplifiers respectively generates M output signals, wherein the N is a positive integer greater than 2, and M is a positive integer not equal to N.

In an embodiment of the present invention, each of the amplifiers includes an input transformer, an amplifier and an output transformer. A terminal of a primary side of the input transformer receives the input signal corresponding to each of the power amplifiers. A second terminal of the primary side of the input transformer is coupled to a reference grounding terminal. And a center tap terminal of a secondary side of the input transformer is coupled to a reference voltage. The amplifier has two input terminals and two output terminals, the two input terminals are configured at a side of amplifier and are respectively coupled to two terminals of the secondary side of the input transformer, and the two output terminals are configured at the other side of the amplifier. Two terminals of a primary side of the output transformer are respectively coupled to the two output terminal of the amplifier, a center tap terminal of the primary side of the output transformer is coupled to the reference voltage, a terminal of a secondary side of the output transformer is coupled to the reference grounding terminal, and the other terminal of the secondary side of the output transformer generates the output signal corresponding to each of the power amplifiers.

In an embodiment of the present invention, the output terminals of the power amplifiers that receive input signals with the same frequency band are coupled to each other to generate one of the output signals.

In an embodiment of the present invention, the power amplifying apparatus further includes a bias circuit, coupled to the power amplifiers, respectively provides a plurality of bias voltages to the power amplifiers.

In an embodiment of the present invention, the power amplifying apparatus further includes an antenna multiplexer, coupled to the output terminals of the power amplifiers, selects at least one of the output signals to output.

In an embodiment of the present invention, the power amplifying apparatus further includes a second substrate and N transmission wires. The transmission wires are disposed on the second substrate, and the transmission wires respectively coupled to the input terminals of the amplifiers to transmit the input signals.

In an embodiment of the present invention, the above described transmission wires corresponding to transmit input signals with the same frequency band are coupled to each other on the second substrate.

In an embodiment of the present invention, the above described power amplifier includes a first power amplifier, a second power amplifier, a third power amplifier and a fourth power amplifier. The first power amplifier receives a first input signal in a first frequency band, and generates a first output signal in the first frequency band. The second power amplifier receives a second input signal in a second frequency band, and generates a second output signal in the second frequency band. The third power amplifier, receives a third input signal in a third frequency band, and generates a first part of a third output signal in the third frequency band. The fourth power amplifier receives a fourth input signal in the third frequency band, and generates a second part of the third output signal in the third frequency band.

In an embodiment of the present invention, the output terminal of the third power amplifier and the output terminal of the fourth power amplifier are coupled to each other to combine the first part and second part of the third output signal to generate the third output signal.

In an embodiment of the present invention, the first frequency band is the frequency band of Code Division Multiple Access (CDMA), the second frequency band is the frequency band of Global System for Mobile (GSM), and the third frequency band is the frequency band of Time-Division Duplex Long Term Evolution (TDD-LTE) or the frequency band of Frequency-Division Duplex Long Term Evolution (FDD-LTE).

In an embodiment of the present invention, the transmission wire transmitting the third output signal is disposed between the transmission wires transmitting the first and the second output signal, and the transmission wires transmitting the first and the second output signal are disposed on the first substrate along a trace line direction in parallel.

In an embodiment of the present invention, the power amplifying apparatus further includes N output wires. The output wires are disposed on the first substrate along a trace line direction, and the transmission wires respectively coupled to output terminals of the power amplifiers to transmit the output signals respectively, wherein the transmission wires are parallel to each other, and transmission wires outputting the output signals in the same frequency band are not directly adjacent to each other.

In an embodiment of the present invention, reference grounds coupled to the power amplifiers are mutually independent.

Based on above, the present invention generates a power amplifying apparatus through disposing a plurality of power amplifiers on a substrate. The power amplifiers is capable of receiving a plurality of input signals respectively, wherein the input signals are not exactly in the same frequency bands. That is to say, the power amplifying apparatus in the present invention is capable of receiving a plurality of signals in multi-frequency bands to conduct power amplifying, and so as to reach the needs of multi-frequency band operations.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
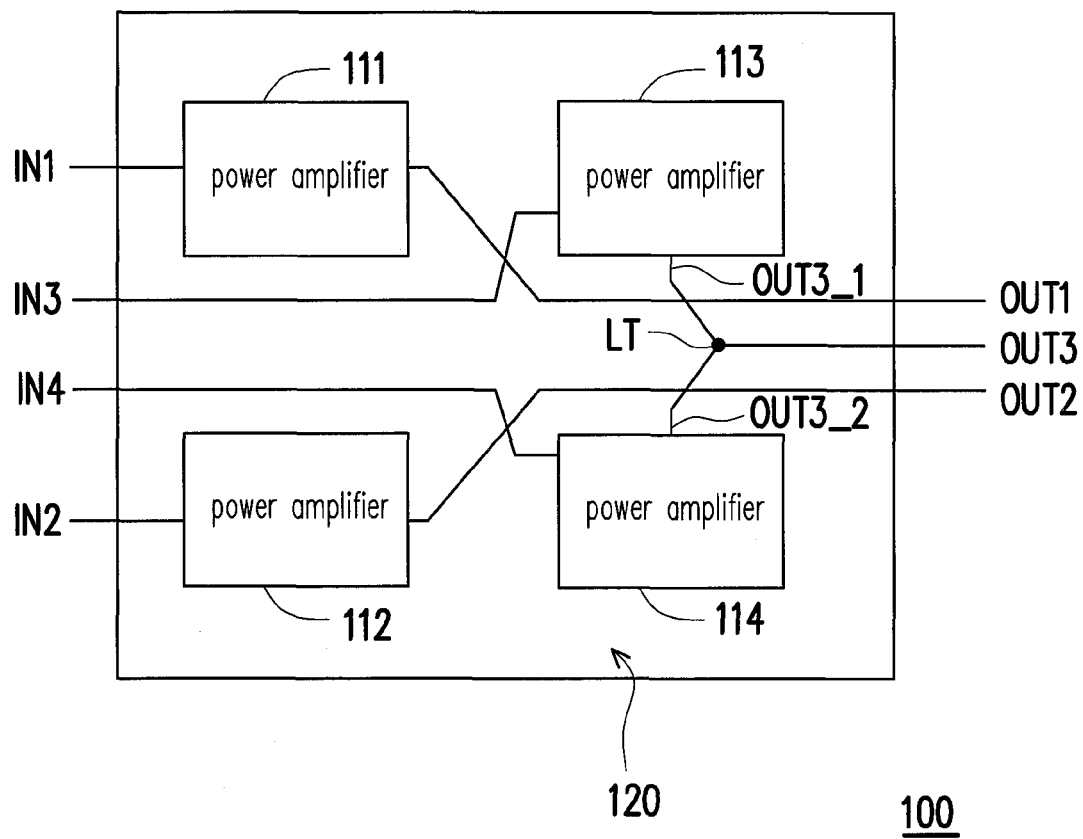
FIG. 1 illustrates a schematic diagram of a power amplifying apparatus 100 according to an exemplary embodiment of the present invention.

Referring to FIG. 1, FIG. 1 illustrates a schematic diagram of a power amplifying apparatus 100 according to an exemplary embodiment of the present invention. The power amplifying apparatus 100 includes substrate 120 and power amplifiers 111-114. The power amplifiers 111-114 are disposed on the substrate 120. The power amplifiers 111-114 respectively receives input signals IN1-IN4. The power amplifiers 111-114 amplify the received input signals IN1-IN4, and generate output signals OUT1-OUT3 thereby. Herein, in the present exemplary embodiment, due to the data linearity requirement in Long Term Evolution (LTE), input signal IN3 and IN4 are signals in the same frequency band, and input signal IN1 and IN3 are signals in different frequency bands. On the other hand, the input signal IN2 and IN3 are also signals in different frequency bands.

Also, in the present exemplary embodiment, the input signal IN3-IN4 are signals with the same format, as a result, the power amplifiers 113 and 114 can respectively receive the input signal IN3-IN4 to amplify, and generate output signals OUT3_1 and OUT3_2 respectively. Output terminals of the power amplifier 113 and 114 are coupled to terminal LT in parallel, so that output signals OUT3_1 and OUT3_2 can be summed through the terminal LT to generate the output signal OUT3.

In addition, in order to prevent mutual interference of signals with similar frequencies, transmission wires that transmits signals in different frequency bands can be used to isolate the transmission wires that transmits signals in the same or adjacent frequency bands on the circuit layout in the present exemplary embodiment, so that the mutual interference of the signals in the same frequency band or adjacent frequency bands can be prevented. The input signals IN3 and IN2 can be input signals in the same frequency band, or in adjacent frequency bands with different format. In particular, output signals OUT1 and OUT 2 generated by power amplifier 111 and 114 can be signals in the same frequency band, or in adjacent frequency bands, or the frequency of one of the output signals OUT1 and OUT 2 can be an integer multiple of the frequency of the other. In the present exemplary embodiment of the present invention, the output signal OUT1 and OUT2 are signals with different formats respectively, for example, output signal OUT1 and OUT2 are signals in the frequency band of Code Division Multiple Access (CDMA) and Global System for Mobile (GSM) respectively, or the output signal OUT1 and OUT2 are signals in the frequency band of Wide band Code Division Multiple Access (WCDMA) and GSM respectively. Moreover, the frequency band of the output signal OUT3 that jointly generated by the power amplifier 112 and 113 is different from the frequency band of the output signal OUT1 and OUT2. As a result, through disposing the transmission wire that transmits the output signal OUT3 between the transmission wires that transmit the output signals OUT1 and OUT2 to isolate the transmission wires that transmit the output signals OUT1 and OUT2, the phenomenon of mutual interference between the output signals OUT1 and OUT2 can be prevented effectively.

From the explanation described above, it should be understand that the power amplifying apparatus 100 of the present exemplary embodiment of the invention is capable of simultaneously receiving input signals to amplify, also, the received input signals can be in at least two different frequency bands or be in different frequency bands more than two. These input signals with different frequency bands and the output signals generated correspondingly can be isolated effectively, so that the interference would not be generated and the signal transmission quality could be maintained thereby.

In addition, in the presented embodiment, setting the amount of the power amplifier as 4 (e.g., power amplifier 111-114) is only an exemplary example. In other exemplary embodiment of the present invention, the amount of the power amplifier is not limited to 4. For example, the amount of the power amplifier on the substrate can be expanded to 6, and the extra two power amplifier can be configured to receive signals in frequency band same with (or different from) the input signals IN1-IN4 to amplify.

Figure 2:
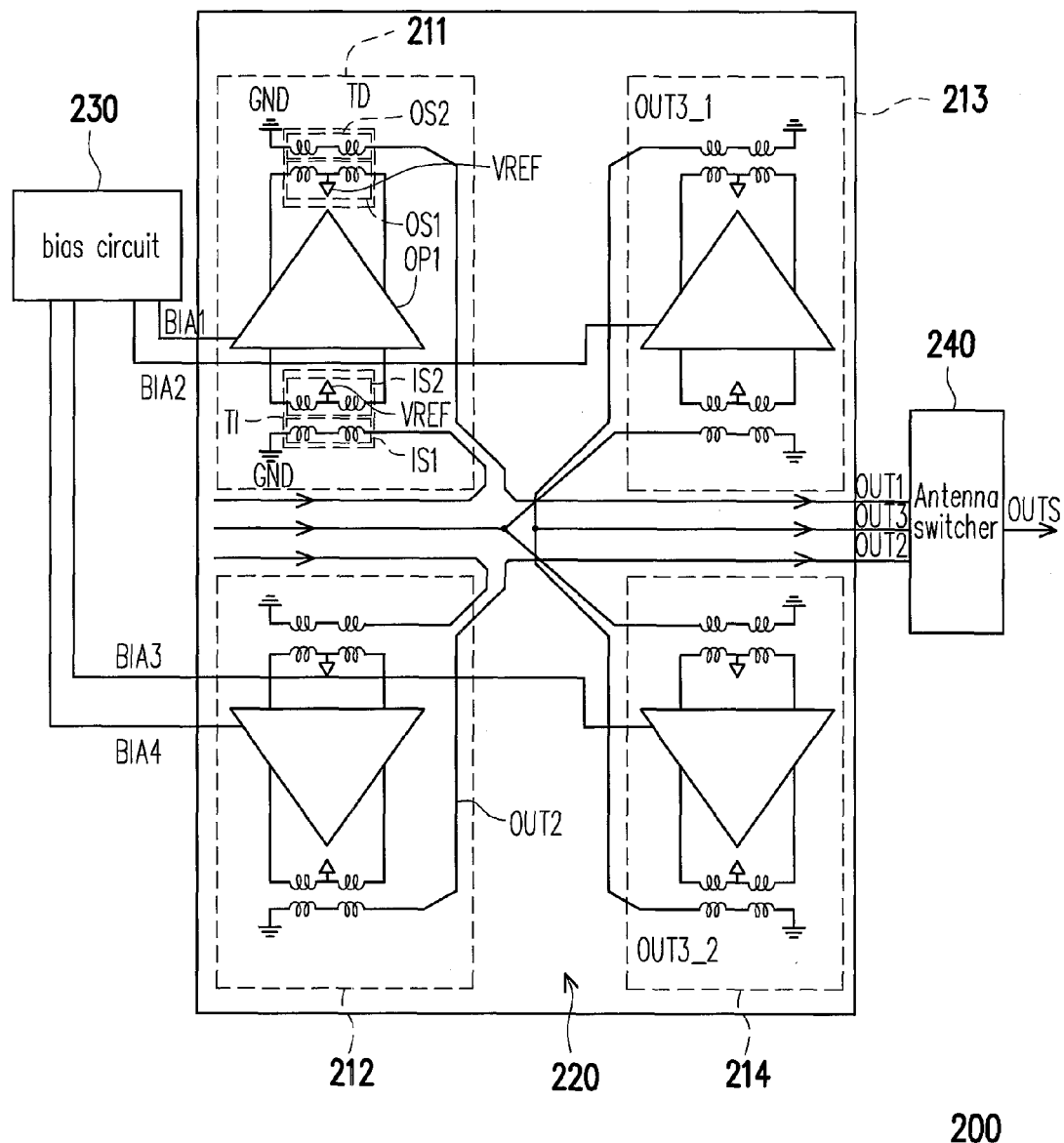
FIG. 2 illustrates a schematic diagram of a power amplifying apparatus 200 according to another exemplary embodiment of the present invention.

Referring to FIG. 2, FIG. 2 illustrates a schematic diagram of a power amplifying apparatus 200 according to another exemplary embodiment of the present invention. The power amplifying apparatus includes a substrate 220, power amplifier 211-214, a bias circuit 230 and an antenna switcher 24. The power amplifier 211-214 are disposed on the substrate 220, the power amplifier 211-214 receive input signals IN1, IN2, IN3 and IN4 respectively, and respectively amplify the input signals IN1, IN2, IN3 and IN4 to generate the output signals OUT1、OUT2、OUT3_1以及OUT3_2. Regarding to the implementation details of the power amplifier 211-214, take the power amplifier 211 as an example, the power amplifier 211 includes an input transformer TI, an amplifier OP1 and an output transformer TO. The amplifier OP1 has two input terminals and two output terminals, the two input terminals are configured at a side of amplifier OP1 and the two output terminals are configured at the other side of the amplifier OP1. The input transformer TI has a primary side IS1 and a secondary side IS2. A terminal of a primary side of the input transformer TI receives the input signal IN1, and the other terminal is coupled to a reference grounding terminal GND. Two terminals of the secondary side IS2 of the input transformer TI are coupled to the two input terminals of the amplifier OP1, and a center tap terminal of the secondary side IS2 of the input transformer TI is coupled to a reference voltage VREF. The amplifier OP1 is a differential amplifier.

On the other hand, the output transformer TO has a primary side OS1 and a secondary side OS2. Two terminals of the primary side OS1 of the output transformer TO are respectively coupled to the two differential output terminal of the amplifier OP1, a center tap terminal of the primary side OS1 of the output transformer TO receives the reference voltage VREF. A terminal of the secondary side OS2 of the output transformer TO is coupled to the reference grounding terminal GND, and the other terminal of the secondary side OS2 of the output transformer OS2 generates the output signal OUT1.

The bias circuit 230 is coupled to the power amplifiers 211-214. The bias circuit 230 generates bias voltages BIA1-BIA4 and respectively provides the bias voltages BIA1-BIA4 to the power amplifiers. The bias circuit could determine whether to generate the bias voltages BIA1-BIA4 according to enablement of the power amplifier 211-214. For example, when the power amplifier 211 does not need to be enabled but the power amplifiers 212-214 need to be enabled, the bias circuit 230 can generate bias voltage BIA2-BIA4 so that the power amplifiers 212-214 is operable, and disable the power amplifier 211 through the bias voltage BIA1.

The antenna switcher 240 is coupled to the output terminals of the power amplifiers 211-214 to receive the output signal OUT1-OUT3. The antenna switcher 240 also selects one of the output signal OUT1-OUT3 to output. Herein, the antenna switcher 240 can selects one of the output signal OUT1-OUT3 as a selected output signal OUTS according to the frequency band of a desired signal, and transmits the selected output signal OUTS to an antenna.

In the present exemplary embodiment, the input signal IN1 can be signal in the frequency band of Code Division Multiple Access (CDMA), the input signal IN2 can be signal in the frequency band of Global System for Mobile (GSM), and input signal IN3 can be signal in the frequency band of Time-Division Duplex Long Term Evolution (TDD-LTE) or Frequency-Division Duplex Long Term Evolution (FDD-LTE).

In the configuration of the transmission wires, transmission wires that transmit the same-frequency-band input signal IN1 and IN2 can be isolated through configuring the transmission wire that transmits the input signal IN3 in different frequency band in between. Moreover, transmission wires that transmit the same-frequency-band output signal OUT1 and OUT2 can be isolated through configuring the transmission wire that transmits the output signal OUT3 in different frequency band in between. As a result, the mutual interference between signals can be eliminated, and the signal quality of signal transmission could be maintained. Herein, the output signal OUT1 and OUT2, for example, are respectively GSM signals and CDMA signals, and also, the output signal OUT1 and OUT2 would be generated simultaneously as voice signals. Meanwhile, the output signal OUT3, as a LTE signal, would not be generated, so a loop for noise defense could be formed by the reference grounding terminal coupled by the transformer which connected by the transmission wire that configures to transmit the output signal OUT3, for eliminate the noise caused by the mutual interference of the output signal OUT1 and OUT2. That is to say, the power amplifying apparatus could operate with the output signal OUT1 and OUT2 simultaneously without using extra protection circuit to or noise separation mechanism.

It is noted that the reference ground terminals GND coupled by the power amplifier 211-214 could be mutually independent in the present exemplary embodiment. By coupling the power amplifier 211-214 to multiple mutually independent grounding path, the power amplifying apparatus 200 can radiate heat effectively and establish multiple paths for dredging noise, so as to reduce the interference that may caused by noise on the power amplifying apparatus 200.

Figure 3:
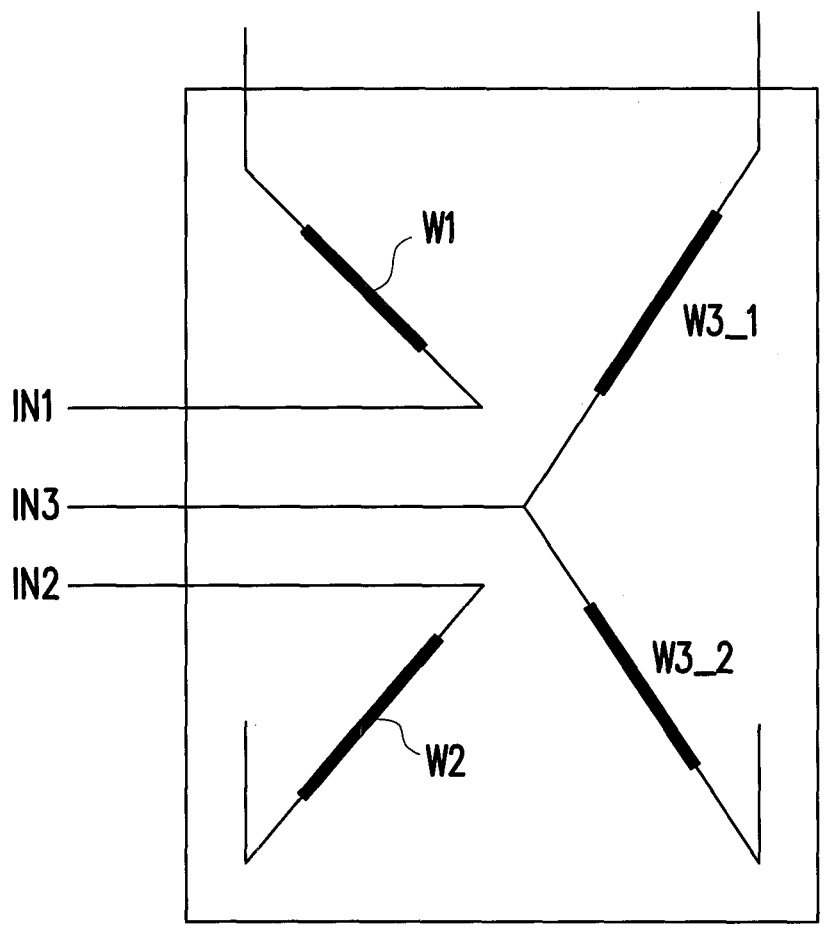
FIG. 3 illustrates a circuit configuration diagram of another substrate of a power amplifying apparatus 300 according to an exemplary embodiment of the present invention.
Figure 4:
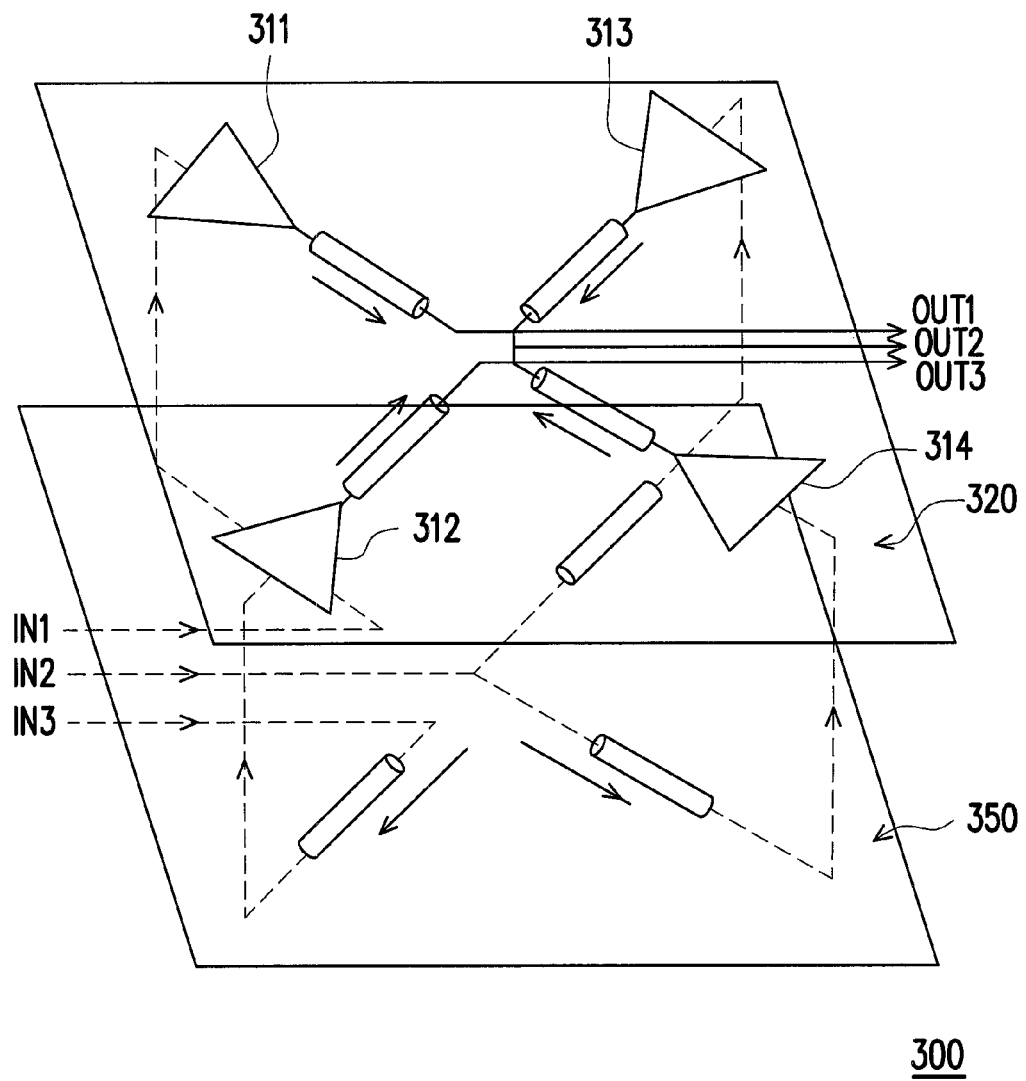
FIG. 4 illustrates a schematic diagram of a power amplifying apparatus 300 according to another exemplary embodiment of the present invention.

Referring to FIG. 3 and FIG. 4, FIG. 3 illustrates a circuit configuration diagram of another substrate of a power amplifying apparatus 300 according to an exemplary embodiment of the present invention, and FIG. 4 illustrates a schematic diagram of a power amplifying apparatus 300 according to another exemplary embodiment of the present invention. Herein, the power amplifying apparatus 300 further includes a substrate 350 where the transmission wires that transmit the input signal IN1-IN3 are disposed. In FIG. 3, the input signal IN1 and IN2 are respectively transmitted through transmission wires W1 and W2 disposed on the substrate 350. The input signal IN3 is transmitted through the transmission wires W3_1 and W3_2 that mutually coupled. It should be noted that, in order to the mutual interference of the same-frequency-band input signal IN1 and IN2, the transmission wires W1 and W2 can be isolated through disposing the transmission wire that transmits the input signals IN3 in different frequency band.

It should be understand from FIG. 4, that the substrate 320 and 350 are configured to be overlapped. The power amplifiers 311-314 are disposed on the substrate 320. The transmission wires that transmit the output signals OUT1-OUT3 are configured on the substrate 320 along the same trace line direction. Also, the transmission lines transmitting the output signal OUT1 and OUT2 are effectively isolated through disposing the transmission wire transmitting the output signal OUT3 in between, to avoid the phenomenon of signal interference.

From the illustration in FIG. 3 and FIG. 4, it should be understand that, similar to the exemplary embodiment shown in FIG. 2, the input signal IN1 and IN2 can be generated simultaneously as voice signals. Meanwhile, the input signal IN3, as LTE signal, would not be generated. As a result, a loop for noise defense could be formed by the reference grounding terminal coupled by the transformer which connected by the transmission wire W3_1 and W3_2, for eliminating the noise caused by the mutual interference of the input signal IN1 and IN2.

Figure 5:
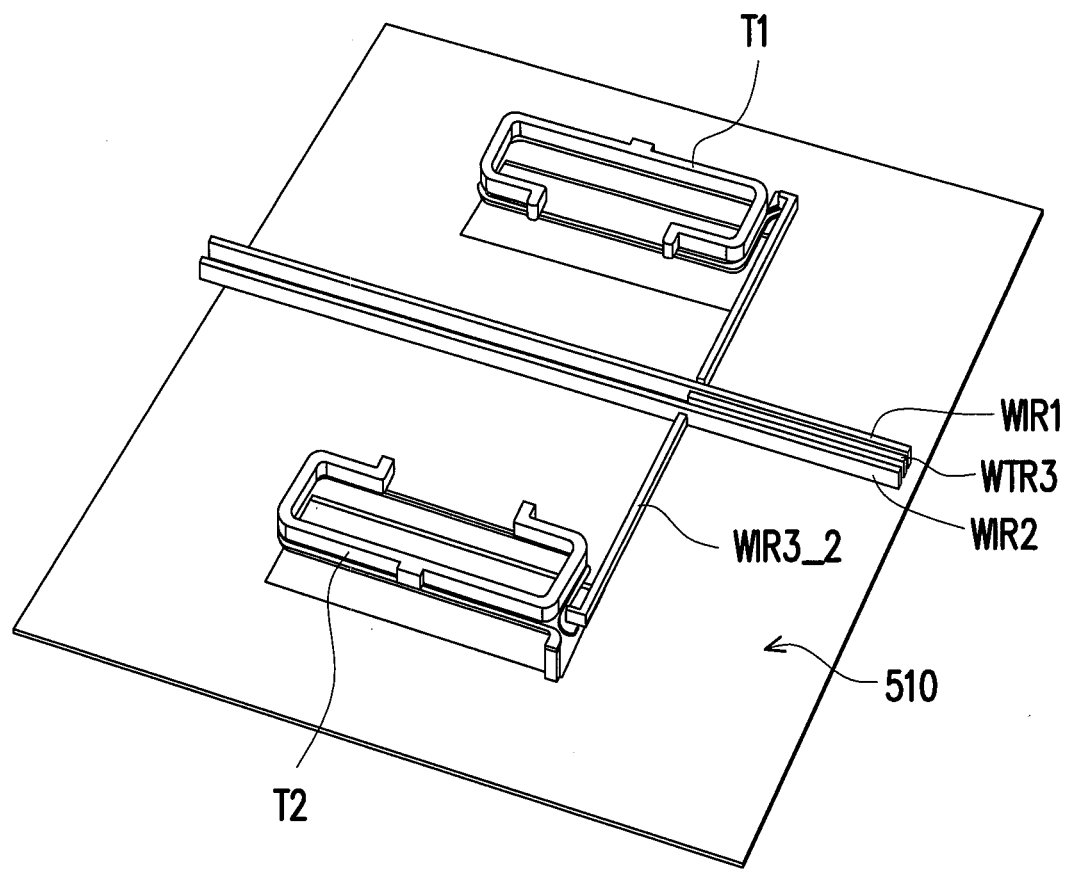
FIG. 5 illustrates a schematic diagram of part of layout of a power amplifying apparatus according to another exemplary embodiment of the present invention.

Referring to FIG. 5, FIG. 5 illustrates a schematic diagram of part of layout of a power amplifying apparatus according to another exemplary embodiment of the present invention. Herein, on the substrate 510, the transmission wires WIR3_1 and WIR3_2 of the output signals are coupled to transformers T1 and T2 respectively. And the transmission wires WIR3_1 and WIR3_2 are commonly coupled to the transmission wire WIR3 to transmit the output signal. Furthermore, the other two transmission wire WIR1 and WIR2 are configured on the substrate 510 in parallel. Also, the transmission wire WIR3 is configured between the transmission wires WIR1 and WIR2.

When transmission wires WIR1 and WIR2 respectively transmit signals such as GSM and CDMA signals, the power amplifier that coupled to the transmission wire WIR3_1 and WIR3_2 is disabled, and the transmission wire WIR3_1 and WIR3_2 are coupled to the reference ground terminal through the output transformer T1 and T2. In other words, transmission wire WIR3 would be coupled to the reference ground terminal and forms a barrier between the transmission wire WIR1 and WIR2 to effectively cut off the possibility of mutual interference between the signals transmitting on the transmission wire WIR1 and WIR2.

In summary, the power amplifying apparatus proposed in the present invention is capable of receiving signals in multiple frequency bands to amplify, and the requirement of multi-frequencies signal processing of an electronic device could be support effectively. Moreover, transmission wires transmitting signals in the same frequency band can be isolated through the configuration of transmission wires transmitting signals in different frequency band, so as to eliminate the possibility of signal interference.

What is claimed is:

1. A power amplifying apparatus, comprising:
   a first substrate; and
   N power amplifiers, disposed on the first substrate, the power amplifiers respectively receive N input signals, wherein the frequency bands of at least two of the inputs signals are different, and the power amplifiers respectively generates M output signals, wherein the N is a positive integer greater than 2, and M is a positive integer and smaller than N, wherein each of the power amplifiers comprises:
      an input transformer, a first terminal of a primary side of the input transformer receives the input signal corresponding to each of the power amplifiers, a second terminal of the primary side of the input transformer is coupled to a reference grounding terminal, and a center tap terminal of a secondary side of the input transformer is coupled to a reference voltage;
      an amplifier, having two input terminals and two output terminals, the two input terminals are configured at a side of amplifier and are respectively coupled to two terminals of the secondary side of the input transformer, and the two output terminals are configured at the other side of the amplifier; and
      an output transformer, wherein two terminals of a primary side of the output transformer are respectively coupled to the two output terminal of the amplifier, a center tap terminal of the primary side of the output transformer is coupled to the reference voltage, a terminal of a secondary side of the output transformer is coupled to the reference grounding terminal, and the other terminal of the secondary side of the output transformer generates the output signal corresponding to each of the power amplifiers.

2. The power amplifying apparatus of claim 1, wherein the output terminals of the power amplifiers that receive input signals with the same frequency band are coupled to each other to generate one of the output signals.

3. The power amplifying apparatus of claim 1, wherein the power amplifying apparatus further comprising:
   a bias circuit, coupled to the power amplifiers, respectively provides a plurality of bias voltages to the power amplifiers.

4. The power amplifying apparatus of claim 1, wherein the power amplifying apparatus further comprising:
   an antenna multiplexer, coupled to the output terminals of the power amplifiers, selects at least one of the output signals to output.

5. The power amplifying apparatus of claim 1, wherein the power amplifying apparatus further comprising:
   a second substrate; and
   N transmission wires, disposed on the second substrate, and the transmission wires respectively coupled to the input terminals of the amplifiers to transmit the input signals.

6. The power amplifying apparatus of claim 5, wherein:
   the transmission wires corresponding to transmit input signals with the same frequency band are coupled to each other on the second substrate.

7. The power amplifying apparatus of claim 1, wherein reference grounds coupled to the power amplifiers are mutually independent.

8. The power amplifying apparatus of claim 1, wherein the power amplifying apparatus further comprising:
   N output wires, the output wires are disposed on the first substrate along a trace line direction, and the output wires respectively coupled to output terminals of the power amplifiers to transmit the output signals respectively, wherein the transmission wires are parallel to each other, and transmission wires outputting the output signals in the same frequency band are not directly adjacent to each other.

9. A power amplifying apparatus, comprising:
   a first substrate; and
   N power amplifiers, disposed on the first substrate, the power amplifiers respectively receive N input signals, wherein the frequency bands of at least two of the inputs signals are different, and the power amplifiers respectively generates M output signals, wherein the N is a positive integer greater than 2, and M is a positive integer and smaller than N, wherein the power amplifiers comprises:
      a first power amplifier, receives a first input signal in a first frequency band, and generates a first output signal in the first frequency band;
      a second power amplifier, receives a second input signal in a second frequency band, and generates a second output signal in the second frequency band;
      a third power amplifier, receives a third input signal in a third frequency band, and generates a first part of a third output signal in the third frequency band; and
      a fourth power amplifier, receives a fourth input signal in the third frequency band, and generates a second part of the third output signal in the third frequency band.

10. The power amplifying apparatus of claim 9, wherein the output terminal of the third power amplifier and the output terminal of the fourth power amplifier are coupled to each other to combine the first part and second part of the third output signal to generate the third output signal.

11. The power amplifying apparatus of claim 9, wherein the first frequency band is the frequency band of Code Division Multiple Access (CDMA), the second frequency band is the frequency band of Global System for Mobile (GSM), and the third frequency band is the frequency band of Time-Division Duplex Long Term Evolution (TDD-LTE) or the frequency band of Frequency-Division Duplex Long Term Evolution (FDD-LTE).

12. The power amplifying apparatus of claim 9, wherein the transmission wire transmitting the third output signal is disposed between the transmission wires transmitting the first and the second output signal, and the transmission wires transmitting the first and the second output signal are disposed on the first substrate along a trace line direction in parallel.

13. The power amplifying apparatus of claim 12, wherein when the first amplifier and the second amplifiers are enabled, the third and the fourth amplifier are disabled.

14. The power amplifying apparatus of claim 13, wherein when the third and the fourth amplifier are disabled, the transmission wire transmitting the third output signal is coupled to the reference grounding terminal through the transformer of the third and the fourth amplifier, the transmission wire transmitting the third output signal is used to prevent a mutually interference of the first and the second output signal.

15. The power amplifying apparatus of claim 9, wherein at least part of the first frequency band and the second frequency band are overlapped, and the third frequency band is not overlapped with the first or the second frequency band.

* * * * *